(12) United States Patent
Tsujii et al.

(10) Patent No.: US 8,928,314 B2
(45) Date of Patent: Jan. 6, 2015

(54) MAGNETIC DETECTION APPARATUS

(75) Inventors: Shigeki Tsujii, Chiyoda-ku (JP);
Mitsuhiro Ono, Chiyoda-ku (JP);
Hiroshi Kobayashi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 350 days.

(21) Appl. No.: 13/314,993

(22) Filed: Dec. 8, 2011

(65) Prior Publication Data
US 2012/0293169 A1 Nov. 22, 2012

(30) Foreign Application Priority Data
May 18, 2011 (JP) .................................. 2011-111020

(51) Int. Cl.
*G01N 27/72* (2006.01)
*G01R 33/00* (2006.01)

(52) U.S. Cl.
CPC .................................. *G01R 33/0017* (2013.01)
USPC ........................................................ 324/228

(58) Field of Classification Search
None
See application file for complete search history.

(56) References Cited

U.S. PATENT DOCUMENTS

| | | | |
|---|---|---|---|
| 5,014,005 A * | 5/1991 | Murata et al. | 324/207.2 |
| 5,637,995 A * | 6/1997 | Izawa et al. | 324/174 |
| 6,291,990 B1 * | 9/2001 | Nakane et al. | 324/207.25 |
| 6,326,779 B1 * | 12/2001 | Shinjo et al. | 324/207.21 |
| 6,427,316 B1 * | 8/2002 | Shinjo et al. | 29/602.1 |
| 7,084,620 B2 * | 8/2006 | Tsujii et al. | 324/207.2 |
| 7,441,322 B2 * | 10/2008 | Shinjo et al. | 29/595 |
| 7,453,262 B2 | 11/2008 | Kawasaki et al. | |
| 8,378,674 B2 * | 2/2013 | Furukawa et al. | 324/252 |
| 2002/0181207 A1 | 12/2002 | Karino et al. | |
| 2004/0080314 A1 | 4/2004 | Tsujii et al. | |

FOREIGN PATENT DOCUMENTS

| | | |
|---|---|---|
| JP | 2002-357617 A | 12/2002 |
| JP | 2004-144601 A | 5/2004 |
| JP | 2004-309448 A | 11/2004 |
| JP | 2006-208247 A | 8/2006 |
| JP | 2006-308330 A | 11/2006 |
| WO | 2008-146809 A1 | 12/2008 |

OTHER PUBLICATIONS

Japanese Offices Action dated Jul. 30, 2013, issued in Japanese Patent Application No. 2011-111020.
Japanese Office Action, dated Apr. 23, 2013 JPA No. 2011-111020.

* cited by examiner

*Primary Examiner* — Paresh Patel
(74) *Attorney, Agent, or Firm* — Sughrue Mion, PLLC; Richard C. Turner

(57) ABSTRACT

A magnetic detection apparatus comprises: a magnetic detection section which is obtained by pressing a base including a magnetic detection device, and magnetic field generation means fixed to the base, into a cap so as to integrate the base, the magnetic field generation means, and the cap; and a secondary molding section including an attachment section for attaching the magnetic detection section, and a connector section for extracting a signal detected by the magnetic detection section.

8 Claims, 9 Drawing Sheets

MAGNETIC DETECTION APPARATUS

BACKGROUND OF THE INVENTION

1. Field of the Invention

The present invention relates to a detection apparatus for detecting the change in a magnetic field, and particularly, to a magnetic detection apparatus for detecting the rotation of a magnetic material.

2. Description of the Background Art

As a conventional magnetic detection apparatus, there is disclosed a magnetic detection apparatus including: a magnetic head including a magnetic detection device and magnetic field generation means; a circuit board electrically connected to the magnetic detection device; an inner housing in which the magnetic head and the circuit board are provided; a cap section that covers the magnetic head and has a detection surface; and an outer housing for coupling the inner housing and the cap section (for example, see Japanese Laid-Open Patent Publication No. 2004-309448, paragraphs [0015] to [0022] and FIG. 1).

In addition, there is disclosed a magnetic detection apparatus including: a first block including a magnetic resistance device for detecting the change in a magnetic field, an electronic component that composes a protection circuit against an external noise, a first lead frame electrically connected to the electronic component, and a first base formed by sealing the electronic component, the first lead frame, and the magnetic resistance device by resin; a second block including a magnet, for generating a magnetic field, provided so as to face a subject to be detected, a second lead frame that is electrically connected to the first lead frame and includes a connector terminal for outputting a signal outputted from the magnetic resistance device, to the outside, and a second base formed by sealing the second lead frame by resin; and an exterior resin covering the second block and the first block (for example, see Japanese Laid-Open Patent Publication No. 2004-144601, paragraphs [0007] to [0013] and FIG. 1).

In the magnetic detection apparatus disclosed in Patent Document 1, a lead that composes a connector terminal is formed by insert molding. Therefore, in order to adapt the magnetic detection apparatus to connectors having a variety of specifications, inner housings need to be provided so as to correspond to respective connectors. In addition, the positional relationship between the magnetic detection device and a magnet, which determines the performance, needs to be optimized for each shape of inner housings. In addition, a lead terminal needs to be inserted in a mold when the inner housing is manufactured. Thus, there is a problem that the productivity is limited.

On the other hand, in the magnetic detection apparatus disclosed in Patent Document 2, when insert molding is performed, the second block is once held in a secondary mold by a pin. After the pin is extracted, the position of the magnetic resistance device or the magnet might vary, and there is a possibility that the accuracy of detection is deteriorated. In addition, a sophisticated molding machine is needed because the pin is extracted during molding. In addition, an insert needs to be inserted in a mold when insert molding is performed. Thus, there is a problem that the productivity is limited.

SUMMARY OF THE INVENTION

The present invention has been made to solve the above problems. An object of the present invention is to provide a magnetic detection apparatus that is capable of: by standardizing a magnetic detection section, adapting to a variety of attachment methods and connectors without changing the magnetic detection section; improving the positional accuracy of the magnetic detection section when molding is performed; and improving the productivity.

A magnetic detection apparatus according to the present invention comprises: a magnetic detection section which is obtained by pressing a base including a magnetic detection device, and magnetic field generation means fixed to the base, into a cap so as to integrate the base, the magnetic field generation means, and the cap; and a secondary molding section including an attachment section for attaching the magnetic detection section, and a connector section for extracting a signal detected by the magnetic detection section.

Owing to the above configuration of the magnetic detection apparatus according to the present invention, the magnetic detection apparatus is capable of: adapting to a variety of attachment methods and connectors without changing the magnetic detection section; improving the positional accuracy of the magnetic detection section when molding is performed; and improving the productivity.

The foregoing and other objects, features, aspects and advantages of the present invention will become more apparent from the following detailed description of the present invention when read in conjunction with the accompanying drawings.

DETAILED DESCRIPTION OF THE PREFERRED EMBODIMENTS OF THE INVENTION

First Embodiment

The first embodiment relates to a magnetic detection apparatus including: a magnetic detection section including a magnetic detection device and magnetic field generation means which determine the performance, and made into a standard component by being pressed into a cap; and a secondary molding section including an attachment section and a connector section which are changed in accordance with purposes.

Figure 1:
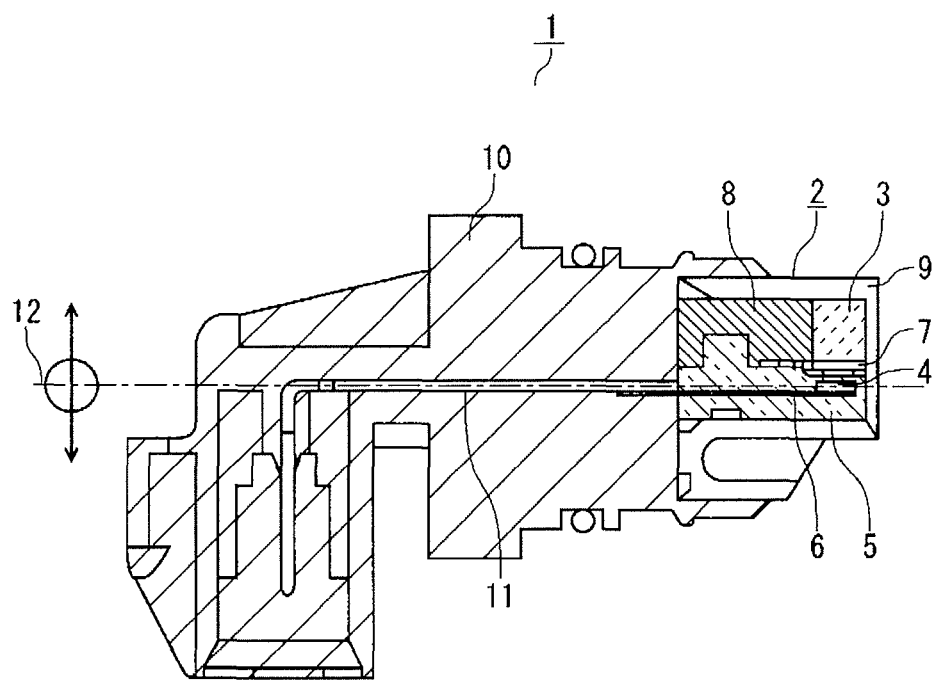
FIG. 1 is a front cross-sectional view of a magnetic detection apparatus according to a first embodiment of the present invention.
Figure 2:
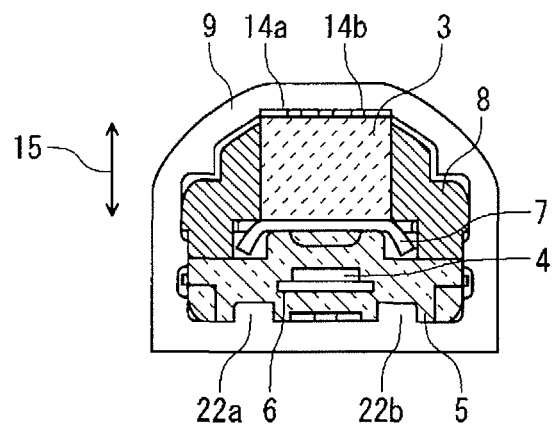
FIG. 2 is a cross-sectional view of a tip portion of a cap of the magnetic detection apparatus according to the first embodiment of the present invention.
Figure 3:
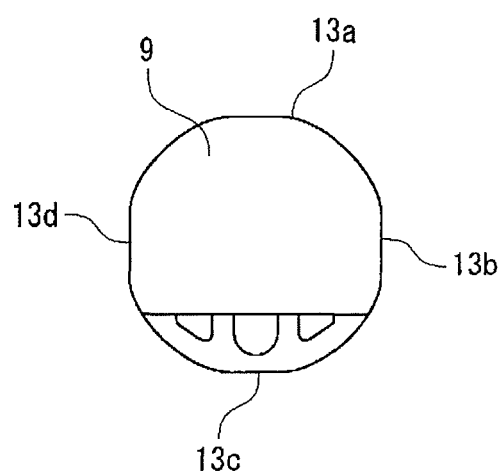
FIG. 3 is a front view of the cap of the magnetic detection apparatus according to the first embodiment of the present invention.
Figure 4:
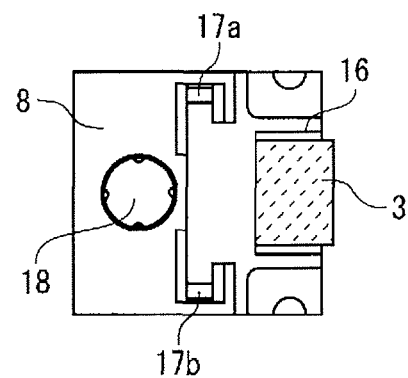
FIG. 4 is a component assembly view of a holder of the magnetic detection apparatus according to the first embodiment of the present invention.
Figure 5:
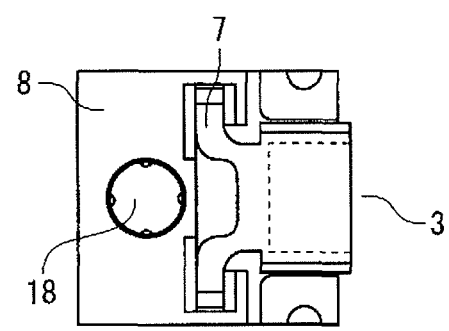
FIG. 5 is another component assembly view of a holder of the magnetic detection apparatus according to the first embodiment of the present invention.
Figure 6:
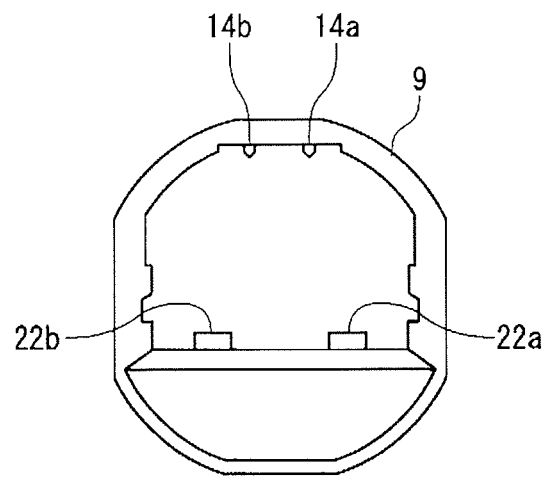
FIG. 6 is a back view of the cap of the magnetic detection apparatus according to the first embodiment of the present invention.
Figure 7:
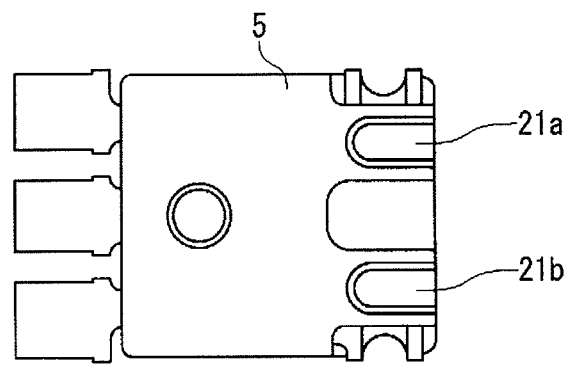
FIG. 7 is a bottom view of a base of the magnetic detection apparatus according to the first embodiment of the present invention.
Figure 8:
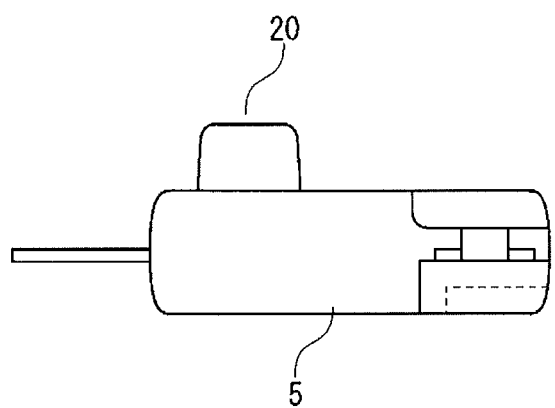
FIG. 8 is a side view of the base of the magnetic detection apparatus according to the first embodiment of the present invention.
Figure 9:
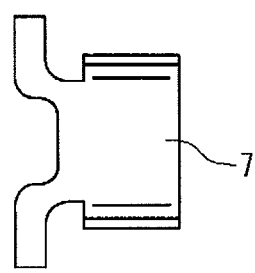
FIG. 9 is a top view of a guide of the magnetic detection apparatus according to the first embodiment of the present invention.
Figure 10:
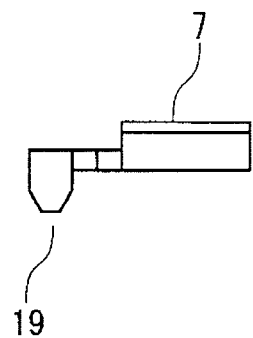
FIG. 10 is a side view of the guide of the magnetic detection apparatus according to the first embodiment of the present invention.

Hereinafter, the configuration and operation according to the first embodiment of the present invention will be described with reference to FIG. 1 showing a front cross-sectional view of the magnetic detection apparatus, FIG. 2 showing a cross-sectional view of a tip portion of the cap, FIG. 3 showing a front view of the cap, FIG. 4 showing a component assembly view of a holder, FIG. 5 showing another component assembly view of the holder, FIG. 6 showing a back view of the cap, FIG. 7 showing a bottom view of a base, FIG. 8 showing a side view of the base, FIG. 9 showing a top view of a guide, and FIG. 10 showing a side view of the guide.

First, the configuration of a magnetic detection apparatus 1 according to the first embodiment of the present invention will be described with reference to the front cross-sectional view in FIG. 1. It is noted that the front cross-sectional view is a view showing a cross-sectional surface of the magnetic detection apparatus 1 taken along a vertical plane including a central axis in the axis direction of the magnetic detection apparatus 1.

As shown in FIG. 1, the magnetic detection apparatus 1 mainly includes a magnetic detection section 2 as a main body and a secondary molding section 10. The magnetic detection section 2 is a fundamental part that determines the performance of the magnetic detection apparatus 1, including magnetic field generation means 3 for generating a magnetic field, and a magnetic detection device 4 for detecting the change in the magnetic field due to a movement of the magnetic field.

The secondary molding section 10 includes an attachment section for attaching the magnetic detection section 2 of the magnetic detection apparatus 1 to another apparatus, and a connector section including an insert 11 for extracting a detected signal.

Hereinafter, the configurations and the procedures of assembly and molding of the magnetic detection section 2 and the secondary molding section 10 will be described.

First, the configuration and the procedure of assembly and molding of the magnetic detection section 2 will be described.

The magnetic detection section 2 of the magnetic detection apparatus 1 includes: the magnetic field generation means 3; the magnetic detection device 4; a base 5 formed by sealing, by resin, a lead frame 6 on which an electronic component composing a protection circuit against an external noise has been mounted; a guide 7, made of a magnetic material, for adjusting a magnetic field generated by the magnetic field generation means 3; a holder 8 for holding the magnetic field generation means 3 and the guide 7; and a cap 9 covering these components in whole.

The manner in which the magnetic field generation means 3 and the guide 7 made of a magnetic material are assembled to the holder 8 will be described with reference to FIGS. 4 and 5 showing component assembly views of the holder 8, and FIGS. 9 and 10 respectively showing a top view and a side view of the guide 7.

The holder 8 has a concave portion 16 into which the magnetic field generation means 3 is pressed, concave portions 17a and 17b for fixing the guide 7 made of a magnetic material, and a concave portion 18 for fixing the base 5. The guide 7 made of a magnetic material has a convex portion 19 which is fitted into the concave portions 17a and 17b of the holder 8.

The concave portion 16 of the holder 8 into which the magnetic field generation means 3 is pressed has ribs on its side surfaces, and the magnetic field generation means 3 is held by the ribs deforming in the pressing (see FIG. 4). In addition, the guide 7 made of a magnetic material is inserted into the concave portions 17a and 17b of the holder 8 and is fixed (see FIG. 5).

Next, the manner in which the base 5 and the holder 8 are assembled will be described with reference to FIG. 7 showing a bottom view of the base 5 and FIG. 8 showing a side view of the base 5.

As shown in the bottom view of the base 5 in FIG. 7, the base 5 has concave portions 21a and 21b which are fitted into convex portions 22a and 22b of the cap 9 described later. As shown in the side view of the base 5 in FIG. 8, the base 5 has a convex portion 20 which is fitted into the concave portion 18 of the holder 8 shown in FIG. 4.

The convex portion 20 of the base 5 is inserted into the concave portion 18 provided on the bottom surface of the holder 8, whereby the holder 8 is fixed to the base 5.

At this time, although the base 5, the magnetic field generation means 3, and the guide 7 made of a magnetic material are pressed into and fixed to the holder 8, the position of the magnetic field generation means 3 in the up-down direction has not been determined, the bottom surface of the magnetic field generation means 3 being in contact with the guide 7 made of a magnetic material, and the top surface being exposed to the outside.

Next, the manner in which the assembled unit including the base 5 is pressed into the cap 9 will be described with reference to FIG. 2 showing a cross-sectional view of the tip portion of the cap 9 and FIG. 6 showing a back view of the cap 9.

The cap 9 shown in FIG. 6 has the convex portions 22a and 22b for positioning. The convex portions 22a and 22b are fitted into the concave portions 21a and 21b of the base 5, whereby the cap 9 and the base 5 are positioned relative to each other.

In FIG. 2 and FIG. 6, reference numerals 14a and 14b represent ribs for press fit provided in the cap 9. In addition, in FIG. 2, an arrow 15 represents the magnetization direction of the magnetic field generation means 3.

The assembled unit including the base 5 is pressed into the cap 9 with the magnetic field generation means 3 being pressed against the guide 7 made of a magnetic material, whereby the components are fixed (see FIG. 2). At this time, the concave portions 21a and 21b on the bottom surface of the base 5 shown in FIG. 7 are fitted into the convex portions 22a and 22b of the cap 9 shown in FIG. 6. In addition, the ribs 14a and 14b for press fit, which are provided in the pressing direction of the magnetic field generation means 3 in the cap 9, deform to ensure that the positional relationship among the magnetic field generation means 3, the guide 7 made of a magnetic material, and the magnetic detection device 4, which is important to the performance of the magnetic detection apparatus 1, is retained.

In addition, as shown in a front view of the cap 9 in FIG. 3, the cap 9 includes plural pairs of mold positioning portions 13 (13a to 13d). By using the plural pairs of mold positioning portions 13 in secondary molding, it becomes possible to form secondary molding sections having different directions.

Hereinafter, the configuration and the procedure of assembly and molding of the secondary molding section 10 will be described.

The insert 11 which composes a connector terminal is connected, by welding, to the lead frame 6 of the magnetic detection section 2 which is obtained by pressing, into the cap 9, the holder 8 into which the magnetic field generation means 3 and the guide 7 have been pressed, and the base 5 including the magnetic detection device 4 as described above.

Next, an assembled unit obtained by connecting the insert 11 to the magnetic detection section 2 is placed in a mold, and then a resin is injected into the mold, whereby secondary molding is performed. By the secondary molding, the secondary molding section 10 which includes the connector section and the attachment section is formed, whereby the entire magnetic detection apparatus 1 is formed.

In addition, a sleeve is also formed at the flange of the attachment section through the insert molding, which sleeve is used for fixing the magnetic detection apparatus 1 with a bolt.

It is noted that in the first embodiment, the insert 11 is formed so as to be arranged in the same plane as a division plane 12 (see FIG. 1) of the mold for the secondary molding.

In the magnetic detection apparatus 1 according to the first embodiment, the guide 7 made of a magnetic material is fixed to the holder 8. However, the guide 7 may not be provided, depending on purposes of use of the magnetic detection apparatus 1.

As described above, in the magnetic detection apparatus 1 according to the first embodiment, the fundamental magnetic detection section 2 including the magnetic field generation means 3 and the magnetic detection device 4, which determines a performance as a magnetic detection apparatus, is completed as a standard product at the stage when the magnetic detection section 2 is pressed into and fixed to the cap 9. Therefore, there are provided the effects that the magnetic detection apparatus 1 can adapt to a variety of attachment methods and connectors without changing the magnetic detection section 2, improve the positional accuracy of the magnetic detection section 2 when molding is performed, and improve the efficiency of production.

In addition, in the magnetic detection apparatus 1 according to the first embodiment, the holder 8 is provided for positioning the magnetic field generation means 3. Therefore, components are easily assembled, and it is ensured that the magnetic field generation means 3 is positioned, whereby it becomes possible to improve the productivity and the accuracy of detection. Since the holder 8 is formed of only a resin, the holder 8 does not need to be formed by insert molding. Therefore, a simplified mold or a simplified molding machine can be used, thereby enabling more efficient work of molding.

In addition, in the magnetic detection apparatus 1 according to the first embodiment, the guide 7 made of a magnetic material for controlling a magnetic field is provided, whereby the detecting performance of a subject to be detected can be improved. In addition, together with the magnetic field generation means 3, the guide 7 is fixed to the holder 8, and then the holder 8 is assembled to the base 5 including the magnetic detection device 4, whereby the positional accuracy is improved resulting in further improvement in the accuracy of detection, and the work of assembly is facilitated resulting in improvement in the productivity.

In addition, in the magnetic detection apparatus 1 according to the first embodiment, when the magnetic field generation means 3 and the base 5 are pressed into and fixed to the cap 9, the ribs for press fit provided toward the magnetization direction of the magnetic field generation means 3 suppress a displacement of the position of the magnetic field generation means 3 in the magnetization direction, which influences the performance of the magnetic detection apparatus 1, whereby the performance can be improved and the variation among the performances can be reduced.

Second Embodiment

In a magnetic detection apparatus 31 according to the second embodiment, the insert 11 is formed so as to be arranged in a plane perpendicular to the division plane 12 of the mold.

Figure 11:
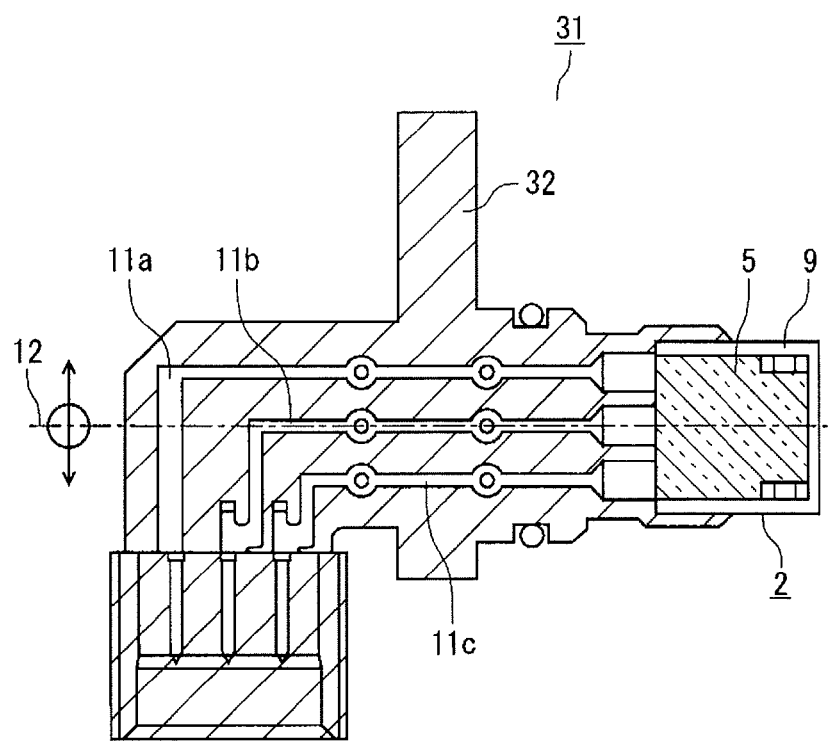
FIG. 11 is a front cross-sectional view of a magnetic detection apparatus of a second embodiment of the present invention.

FIG. 11 is a front cross-sectional view of the magnetic detection apparatus 31 according to the second embodiment. In FIG. 11, components that are the same or correspond to those in FIG. 1 are denoted by the same reference numerals.

In the magnetic detection apparatus 31 according to the second embodiment, the configuration and the procedure of assembly and molding of the magnetic detection section 2 are the same as in the magnetic detection apparatus 1 according to the first embodiment.

Hereinafter, the configuration and the procedure of assembly and molding of the secondary molding section 32 will be described.

The insert 11 which composes a connector terminal is connected, by welding, to the lead frame 6 of the magnetic detection section 2 which is obtained by pressing, into the cap 9, the holder 8 into which the magnetic field generation means 3 and the guide 7 have been pressed, and the base 5 including the magnetic detection device 4. At this time, the insert 11 is formed so as to be arranged in a plane perpendicular to the division plane 12 of the mold.

Next, an assembled unit obtained by connecting the insert 11 to the magnetic detection section 2 is placed in a mold, and then a resin is injected into the mold, whereby secondary molding is performed. As described in the first embodiment, by using the plural pairs of mold positioning portions 13 of the cap 9 in secondary molding, it becomes possible to perform secondary molding in a direction different from that in the first embodiment.

By the secondary molding, the secondary molding section 32 which includes a connector section and an attachment section is formed, whereby the entire magnetic detection apparatus 31 is formed.

Since the insert 11 itself composes the connector terminal, in the magnetic detection apparatus 31, the connector has some degree of freedom with respect to its direction without depending on the division plane of the mold (see FIG. 11).

As described above, in the magnetic detection apparatus 31 according to the second embodiment, the fundamental magnetic detection section 2 including the magnetic field generation means 3 and the magnetic detection device 4, which determines a performance as a magnetic detection apparatus, is completed as a standard product at the stage when the magnetic detection section 2 is pressed into and fixed to the cap 9. Therefore, there are provided the effects that the magnetic detection apparatus 31 can adapt to a variety of attachment methods and connectors without changing the magnetic detection section 2, improve the positional accuracy of the magnetic detection section 2 when molding is performed, and improve the efficiency of production.

In addition, in the magnetic detection apparatus 31 according to the second embodiment, the cap 9 includes the plural pairs of positioning portions 13 for the mold, and the secondary molding is performed by using the mold positioning portions 13, whereby the entire magnetic detection apparatus 31 is formed. Therefore, the effect that the magnetic detection apparatus 31 can adapt to the secondary molding section 32 having a variety of shapes is provided.

Third Embodiment

In a magnetic detection apparatus 51 according to the third embodiment, magnetic field generation means, a magnetic detection device, and a guide are fixed to a base, and the assembled unit is pressed into a cap, whereby a magnetic detection section 52 is formed.

Figure 12:
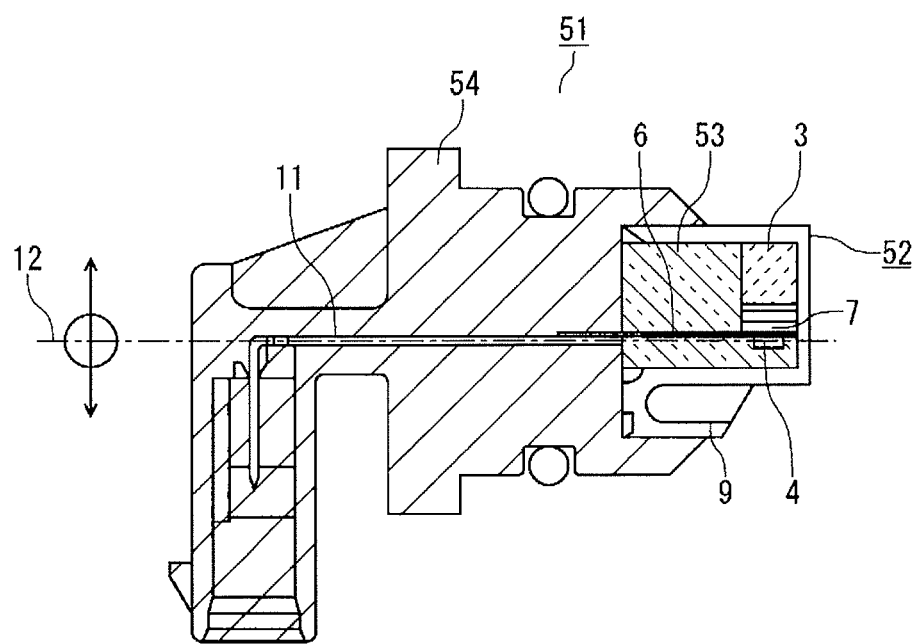
FIG. 12 is a front cross-sectional view of a magnetic detection apparatus of a third embodiment of the present invention.
Figure 13:
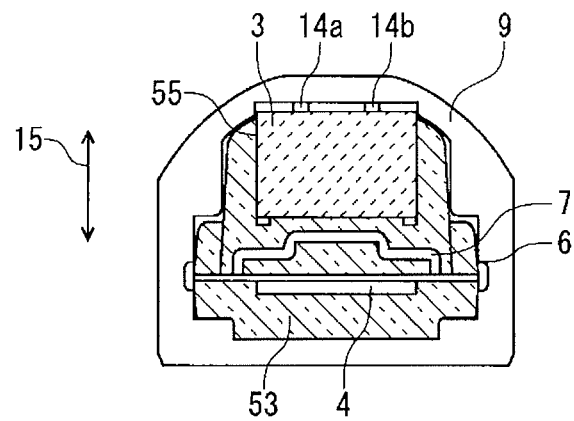
FIG. 13 is a cross-sectional view of a tip portion of a cap of the magnetic detection apparatus according to the third embodiment of the present invention.
Figure 14:
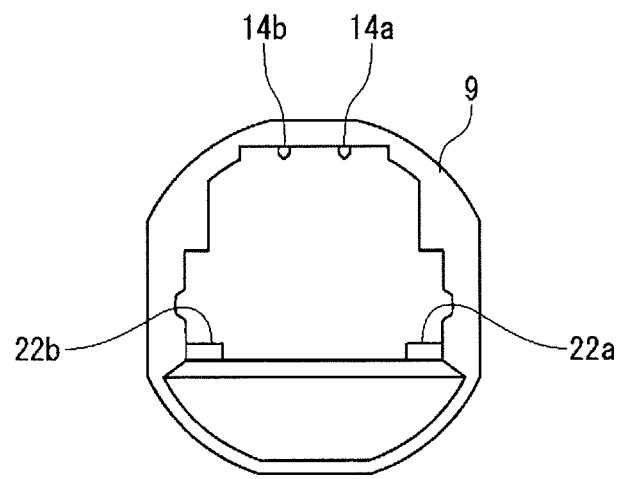
FIG. 14 is a back view of the cap of the magnetic detection apparatus according to the third embodiment of the present invention.
Figure 15:
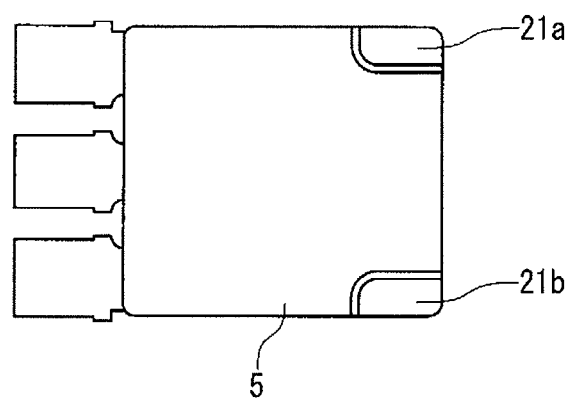
FIG. 15 is a bottom view of a base of the magnetic detection apparatus according to the third embodiment of the present invention.

Hereinafter, the configuration and operation according to the third embodiment of the present invention will be described with reference to FIG. 12 showing a front cross-sectional view of the magnetic detection apparatus, FIG. 13 showing a cross-sectional view of a tip portion of the cap, FIG. 14 showing a back view of the cap, and FIG. 15 showing a bottom view of the base. In FIG. 12, components that are the same or correspond to those in FIG. 1 are denoted by the same reference numerals.

First, the configuration of a magnetic detection apparatus 51 according to the third embodiment of the present invention will be described with reference to the front cross-sectional view in FIG. 12.

As shown in FIG. 12, the magnetic detection apparatus 51 mainly includes the magnetic detection section 52 as a main body and a secondary molding section 54. The magnetic detection section 52 is a fundamental part that determines the performance of the magnetic detection apparatus 51, including the magnetic field generation means 3 for generating a magnetic field, and the magnetic detection device 4 for detecting the change in the magnetic field due to a movement of the magnetic field. The secondary molding section 54 includes an attachment section for attaching the magnetic detection section 52 of the magnetic detection apparatus 51 to another apparatus, and a connector section including the insert 11 for extracting a detected signal.

The magnetic detection section 52 of the magnetic detection apparatus 51 includes: the magnetic field generation means 3; the guide 7, made of a magnetic material, for adjusting a magnetic field generated by the magnetic field generation means 3; a base 53 formed by sealing, by resin, the lead frame 6 on which the magnetic detection device 4 and an electronic component composing a protection circuit against an external noise have been mounted; and the cap 9 covering these components in whole.

The magnetic detection section 52 is different from the magnetic detection section 2 of the first embodiment in that the magnetic field generation means 3 is assembled to the base 53, the guide 7 made of a magnetic material is fixed to the lead frame 6, and accordingly, the holder is removed.

First, the configurations and the procedures of assembly and molding of the magnetic detection section 52 will be described.

The manner in which the magnetic field generation means 3 and the guide 7 made of a magnetic material are assembled to the base 53 will be described with reference to FIG. 13 showing a cross-sectional view of a tip portion of the cap 9, FIG. 14 showing a back view of the cap, and FIG. 15 showing a bottom view of the base.

The base 53 has a concave portion 55 to which the magnetic field generation means 3 is assembled (see FIG. 13). In addition, the base 53 is formed by sealing, by resin, the lead frame 6 on which the magnetic detection device 4 for detecting the change in a magnetic field due to a movement of the magnetic field, and an electronic component composing a protection circuit against an external noise have been mounted.

Also the guide 7 made of a magnetic material for adjusting a magnetic field generated by the magnetic field generation means 3 is fixed to the lead frame 6 included in the base 53 by an adhesive agent. Also the magnetic detection device 4 is fixed to the lead frame 6 by an adhesive agent. Therefore, displacements of the positions of the magnetic detection device 4 and the guide 7 relative to each other can be minimized.

The magnetic field generation means 3 is assembled to the concave portion 55 provided on the based 53 for fixing the magnetic field generation means 3, and then an assembled unit including the base 53 is pressed into and fixed to the cap 9 (see FIG. 13). The cap 9 has, in its inside, the convex portions 22a and 22b for positioning (see FIG. 14). The convex portions 22a and 22b are fitted into the concave portions 21a and 21b of the base 53 (see FIG. 14), whereby the cap 9 and the base 53 are positioned relative to each other.

The ribs 14a and 14b (see FIG. 14) for press fit, which are provided in the pressing direction of the magnetic field generation means 3 in the cap 9, deform to ensure that the positional relationship among the magnetic field generation means 3, the guide 7 made of a magnetic material, and the magnetic detection device 4, which is important to the performance of the magnetic detection apparatus 51, is retained.

Next, the configuration and the procedure of assembly and molding of the secondary molding section 54 will be described.

The insert 11 which composes a connector terminal is connected, by welding, to the lead frame 6 of the magnetic detection section 52 which is obtained by pressing, into the cap 9, the base 53 including the magnetic field generation means 3, the guide 7, and the magnetic detection device 4 as described above.

Next, an assembled unit obtained by connecting the insert 11 to the magnetic detection section 52 is placed in a mold, and then a resin is injected into the mold, whereby secondary molding is performed. By the secondary molding, the secondary molding section 54 which includes the connector section and the attachment section is formed, whereby the entire magnetic detection apparatus 51 is formed.

In addition, a sleeve is also formed at the flange of the attachment section through the insert molding, which sleeve is used for fixing the magnetic detection apparatus 51 with a bolt.

In the magnetic detection apparatus 51 according to the third embodiment, the guide 7 made of a magnetic material is fixed on the lead frame 6 included in the base 53. However, the guide 7 may not be provided, depending on purposes of use of the magnetic detection apparatus 51.

As described above, in the magnetic detection apparatus 51 according to the third embodiment, the fundamental magnetic detection section 52 including the magnetic field generation means 3 and the magnetic detection device 4, which determines a performance as a magnetic detection apparatus, is completed as a standard product at the stage when the magnetic detection section 52 is pressed into and fixed to the cap 9. Therefore, there are provided the effects that the magnetic detection apparatus 51 can adapt to a variety of attachment methods and connectors without changing the magnetic detection section 52, improve the positional accuracy of the magnetic detection section 52 when molding is performed, and improve the efficiency of production.

In addition, in comparison with the magnetic detection apparatus 1 according to the first embodiment, in the magnetic detection apparatus 51 according to the third embodiment, since the magnetic field generation means 3 and the guide 7 are directly fixed to the base 53, the guide 7 can be fixed with a higher positional accuracy, whereby the accuracy of detection can be improved. In addition, since the holder is removed, the effect of simplifying the magnetic detection section 52 is provided.

Various modifications and alterations of this invention will be apparent to those skilled in the art without departing from the scope and spirit of this invention, and it should be understood that this is not limited to illustrative embodiments set forth herein.

What is claimed is:

1. A magnetic detection apparatus comprising:
    a magnetic detection section which is obtained by pressing a base including a magnetic detection device, and magnetic field generation means fixed to the base, into a cap so as to integrate the base, the magnetic field generation means, and the cap; and
    a secondary molding section including an attachment section for attaching the magnetic detection section, and a connector section for extracting a signal detected by the magnetic detection section,
    wherein one of the base and the cap has a convex portion and another of the base and the cap has a concave portion which receives the convex portion as a result of the base being pressed into the cap.

2. The magnetic detection apparatus according to claim 1, wherein a plural pairs of positioning portions for a mold used in secondary molding are provided to the cap.

3. The magnetic detection apparatus according to claim 1, further comprising a holder for fixing the magnetic field generation means.

4. The magnetic detection apparatus according to claim 3, further comprising a guide made of a magnetic material for controlling a magnetic field,
    wherein the guide is fixed to the holder.

5. The magnetic detection apparatus according to claim 1, further comprising a guide made of a magnetic material for controlling a magnetic field,
    wherein the guide is fixed to the base.

6. A magnetic detection apparatus comprising:
    a magnetic detection section which is obtained by pressing a base including a magnetic detection device, and magnetic field generation means fixed to the base, into a cap so as to integrate the base, the magnetic field generation means, and the cap; and
    a secondary molding section including an attachment section for attaching the magnetic detection section, and a connector section for extracting a signal detected by the magnetic detection section
    a rib for press fit provided in the cap in a magnetization direction of the magnetic field generation means for suppressing a displacement of the position of the magnetic field generation means in the magnetization direction when the magnetic field generation means and the base are pressed into the cap.

7. The magnetic detection apparatus according to claim 6,
    wherein a plural pairs of positioning portions for a mold used in the secondary molding section being provided to the cap,
    further comprising
    a holder for fixing the magnetic field generation means,
    a guide made of a magnetic material for controlling a magnetic field, wherein the guide is fixed to the holder.

8. The magnetic detection apparatus according to claim 6,
    wherein a plural pairs of positioning portions for a mold used in secondary molding are provided to the cap,
    further comprising:
    a guide made of a magnetic material for controlling a magnetic field, wherein the guide is fixed to the base.

* * * * *